(12) United States Patent
Possley

(10) Patent No.: US 6,753,209 B2
(45) Date of Patent: Jun. 22, 2004

(54) GATE ARRAY ARCHITECTURE

(75) Inventor: Brian D. Possley, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/902,907

(22) Filed: Jul. 10, 2001

(65) Prior Publication Data

US 2002/0070391 A1 Jun. 13, 2002

Related U.S. Application Data

(63) Continuation of application No. 09/262,458, filed on Mar. 4, 1999.

(51) Int. Cl.⁷ ............................................... H01L 21/82
(52) U.S. Cl. ....................... 438/128; 438/587; 438/598; 257/202
(58) Field of Search ................................. 438/128, 587, 438/598, 129, 309, 1; 257/202, 203, 205, 206, 207, 208, 209, 210, 211, 204

(56) References Cited

U.S. PATENT DOCUMENTS

| | | | |
|---|---|---|---|
| 4,611,236 A | 9/1986 | Shaw | |
| 4,692,783 A | 9/1987 | Monma et al. | |
| 4,816,887 A | 3/1989 | Sato | |
| 5,055,716 A | 10/1991 | El Gamel | |
| 5,068,548 A | 11/1991 | El Gamel | |
| 5,095,356 A | 3/1992 | Ando et al. | |
| 5,117,277 A | 5/1992 | Yuyama et al. | |
| 5,187,556 A | 2/1993 | Nariishi et al. | |
| 5,289,021 A | 2/1994 | El Gamel | |
| 5,341,041 A | 8/1994 | El Gamel | |
| 5,510,636 A | 4/1996 | Murata | |
| 5,563,430 A | 10/1996 | Hasimoto et al. | |
| 5,576,645 A | * 11/1996 | Farwell ........................ 327/94 |
| 5,591,995 A | 1/1997 | Shaw | |
| 5,684,311 A | 11/1997 | Shaw | |
| 5,698,873 A | 12/1997 | Colwell et al. | |
| 5,780,883 A | * 7/1998 | Tran et al. ................... 257/206 |
| 5,789,966 A | 8/1998 | Bachade | |
| 5,796,128 A | 8/1998 | Tran et al. | |
| 5,796,129 A | 8/1998 | Mizuno | |
| 5,932,900 A | * 8/1999 | Lin et al. ..................... 257/204 |
| 5,969,379 A | 10/1999 | Thompson et al. | |

FOREIGN PATENT DOCUMENTS

JP          2000137060 A    *  5/2000

OTHER PUBLICATIONS

SiArc Base Array, SPG Central Logic Engineering, Intel Corporation, 1 pg.

* cited by examiner

*Primary Examiner*—Long Pham
*Assistant Examiner*—Dana Farahani
(74) *Attorney, Agent, or Firm*—Jay P. Beale

(57) ABSTRACT

Briefly, in accordance with one embodiment of the invention, an integrated circuit includes: a gate array architecture. The gate array architecture includes a semiconductor substrate having a plurality of N-type diffusion regions and P-type diffusion regions. The diffusion regions have partially overlying polysilicon landing sites to form N-type and P-type transistors. The regions are relatively sized to form two distinct transistor sizes, smaller N- and P-type transistors and larger N- and P-type transistors.

8 Claims, 7 Drawing Sheets

Table 1

| Name | Clock Pin Power | Notes |
|---|---|---|
| Capacitance Improved | 0.06 pJ | FIG. 2 |
| Si Arc | 0.13 pJ | SiArc CBA |
| Traditional | 0.15 pJ | FIG. 2 | pJ = pico joules

FIG. 6

GATE ARRAY ARCHITECTURE

RELATED APPLICATION

This is a Continuation Patent Application of U.S. patent application Ser. No. 09/262,458, filed Mar. 4, 1999, titled "Gate Array Architecture," by Brian D. Possley, assigned to the assignee of the present application and herein incorporated by reference.

BACKGROUND

1. Field

The present invention is related to integrated circuit chips and, more particularly, to gate array architectures for integrated circuit chips.

2. Background

Gate array architectures are commonly used for many types of integrated circuit designs. In this context, the term gate array architecture refers to a repeated pattern of transistors embedded in a semiconductor or silicon substrate. Typically, such architectures are employed by using a "library" that comprises unique metallization patterns to create individual cells. Such gate array architectures and libraries are commonly employed in connection with computer-aided design (CAD) and/or computer-aided manufacturing (CAM) techniques. Employing a gate array architecture stands in contrast to the custom design of the layout of transistors on a silicon or semiconductor substrate, which is also accomplished using CAD/CAM techniques. Use of gate array architectures offers the advantage of quicker or shorter fabrication and throughput time, lower costs and ease in making fixes or logic changes after a chip design has already been completed. Unfortunately, gate array architectures also have a number of shortcomings that make them less attractive for some types of applications. Typically, gate arrays or gate array architectures are not as dense, have higher power consumption, and offer lower performance than custom circuits designed using alternative approaches. A need, therefore, exists for a gate array architecture that addresses at least some of these limitations.

SUMMARY

Briefly, in accordance with one embodiment of the invention, an integrated circuit includes: a gate array architecture. The gate array architecture includes a semiconductor substrate having a plurality of N-type diffusion regions and P-type diffusion regions. The diffusion regions have partially overlying polysilicon landing sites to form N-type and P-type transistors. The regions are relatively sized to form two distinct transistor sizes, smaller N- and P-type transistors and larger N-and P-type transistors.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description, when read with the accompanying drawings in which:

FIG. 6 is table comparing simulated power consumption between a flip-flop implemented using various gate array architectures including an embodiment of a gate array architecture in accordance with the present invention.

DETAILED DESCRIPTION

Figure 1:
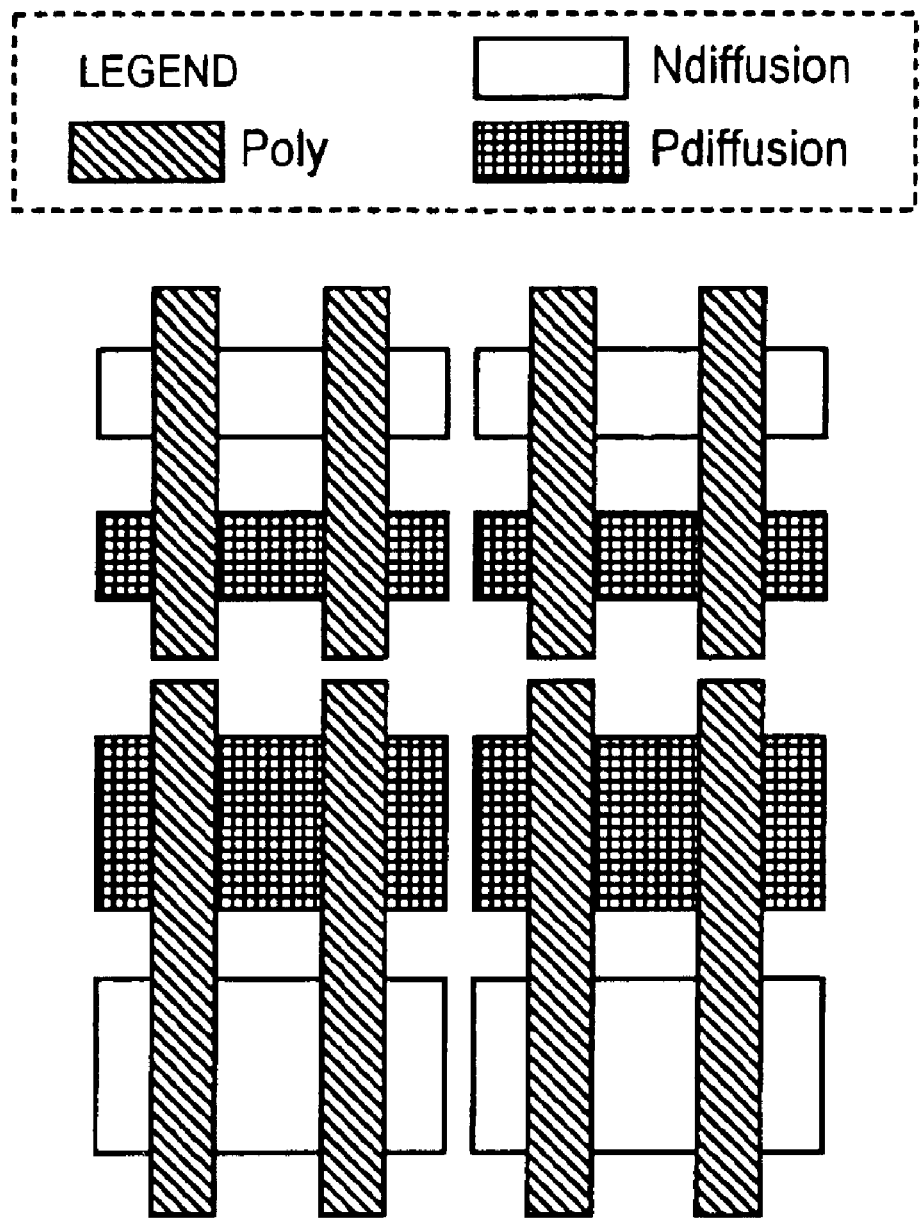
FIG. 1 is a diagram of a plan view of an embodiment of a gate array architecture in accordance with the present invention.

In the following detailed description, numerous specific details are set forth in order to provide a thorough understanding of the invention. However, it will be understood by those skilled in the art that the present invention may be practiced without the specific details. In other instances, well-known methods, procedures, components and circuits have not been described in detail so as not to obscure the present invention.

Typically, at least two approaches may be employed in the computer-aided design of integrated circuit chips. In one approach, each of the cells is individually customized and designed using computer-aided design tools and the cells are interconnected using automatic placement and routing (APR) tools. Another approach that may be employed is where the layout of the silicon or semiconductor is determined before the metallization routing is determined. In this approach, gate array architectures are employed in the silicon or semiconductor that are standard arrays of transistors that may be designed using the appropriate metallization to form many different types of circuits. Therefore, while the silicon is being fabricated in a manufacturing facility to produce the gate arrays of transistors in the silicon, the design of the remaining portion of the chip, such as the portion interconnecting the transistors, continues to occur. This second approach, although resulting in a less customized chip, has the advantage of shorter turn around time in terms of chip production because, while portions of the chip are being manufactured, the remaining portion of the chip is still being designed. Thus, the overall time to design and manufacture the chip is reduced. For the gate array approach, the chip design, as with the customized or, as it is sometimes referred to, the standard cell approach, once the gate array cells are appropriately designed, again, an APR tool is employed to interconnect the metallization of the different cells.

Traditional gate array architectures employ what is commonly referred to as a "sea of transistors" or a "sea of gates" architecture. This means that the gate array base comprises a regularly repeating pattern of individual or group transistors. Having a large number of generic transistors is desirable so that any one of a large number of possible logic functions may be implemented by customizing the metallization above the array. A drawback of this approach is that by offering only a simple, generic transistor pattern, resulting logic implementation is suboptimal in terms of certain technical issues, such as density, power and/or performance.

More recent examples of gate array architectures attempt to address this problem by using a complex base structure comprising many different sizes and configurations of transistors. While this may achieve improved results in terms of density, for example, it may also restrict both synthesis and layout flexibility because the CAD/CAM tools are restricted to using exactly this predetermined mix of different base sites. Furthermore, as shall be explained in more detail hereinafter, such configurations result in undesirable amounts of power consumption compared with embodiments in accordance with the present invention.

Layout of the metallization and vias is typically performed using computer-aided design and computer-aided manufacturing tools. Typically, these tools execute on a system, such as a computer or similar computing platform, in which the circuit designer or other technical personnel design logic cells. Once the logic cells are designed, CAD/CAM tools are then further employed to automatically place and route interconnections between these cells in order to produce the layout for the overall integrated circuit chip. As previously indicated, the systems or tools employed to perform this operation are often referred to as automatic placement and routing or APR systems or tools. A tape is usually produced that contains a data set and/or other electronically stored information which is used by equipment employed to process the silicon, and directs the operations of the equipment to produce the chip. Additional information about such design techniques is provided, for example, in "CMOS Design Methods" Chapter 6 of *Principles of CMOS VLSI Design: A Systems Perspective*, written by Neil Weste and Kamran Eshraghian, available from Addison-Wesley Publishing Company, 1993, $2^{nd}$ Edition.

Figure 3:
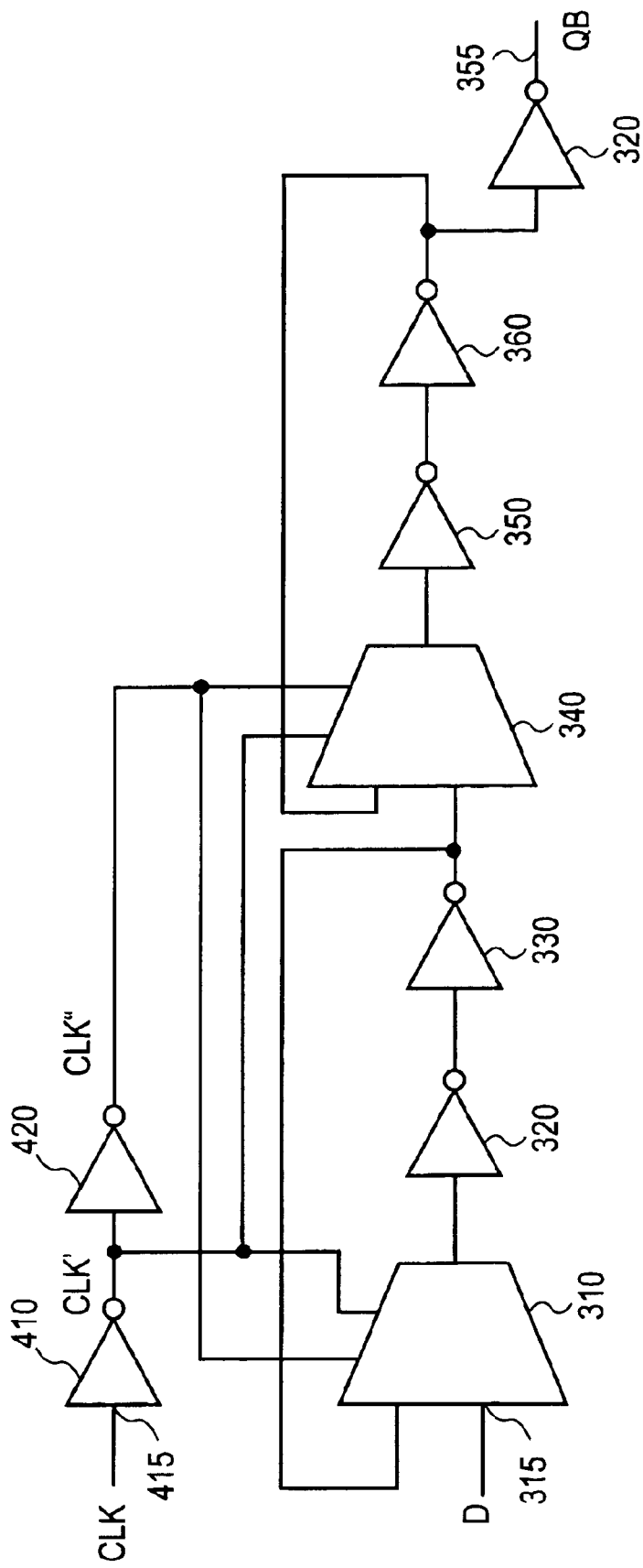
FIG. 3 is a diagram of an embodiment of a flip-flop implemented using digital logic components and functional blocks.

FIG. 3 is a diagram illustrating an embodiment of a flip-flop implemented using functional block elements, such as multiplexors and inverters. For example, flip-flop 300 includes multiplexors 310 and 340 and inverters 320, 330, 350, 360, 370, 410 and 420. As illustrated, this implementation includes a data input port 315, a clock signal input port 415 and an output signal port 355. Of course, output signal port 355 provides "Q bar" (QB), which is an inverted output signal produced by the flip-flop. Alternatively or in addition, the output signal Q could be provided.

In this embodiment the clock signal that is applied to the input port is applied to internal clock buffer circuits that are implemented as inverters 410 and 420. An issue that arises when implementing a flip-flop using a gate array, such as a traditional gate array architecture, is the overall power consumption that results from charging a capacitive load, such as a load associated with internal clock buffers 410 and 420. For example, as shall be explained in more detail hereinafter, if these internal clock buffers were implemented using smaller transistors, this would result in a lower power consumption, as is generally desirable. Of course, the difficulty is accomplishing this using a "sea of transistors" traditional gate array architecture.

Figure 2:
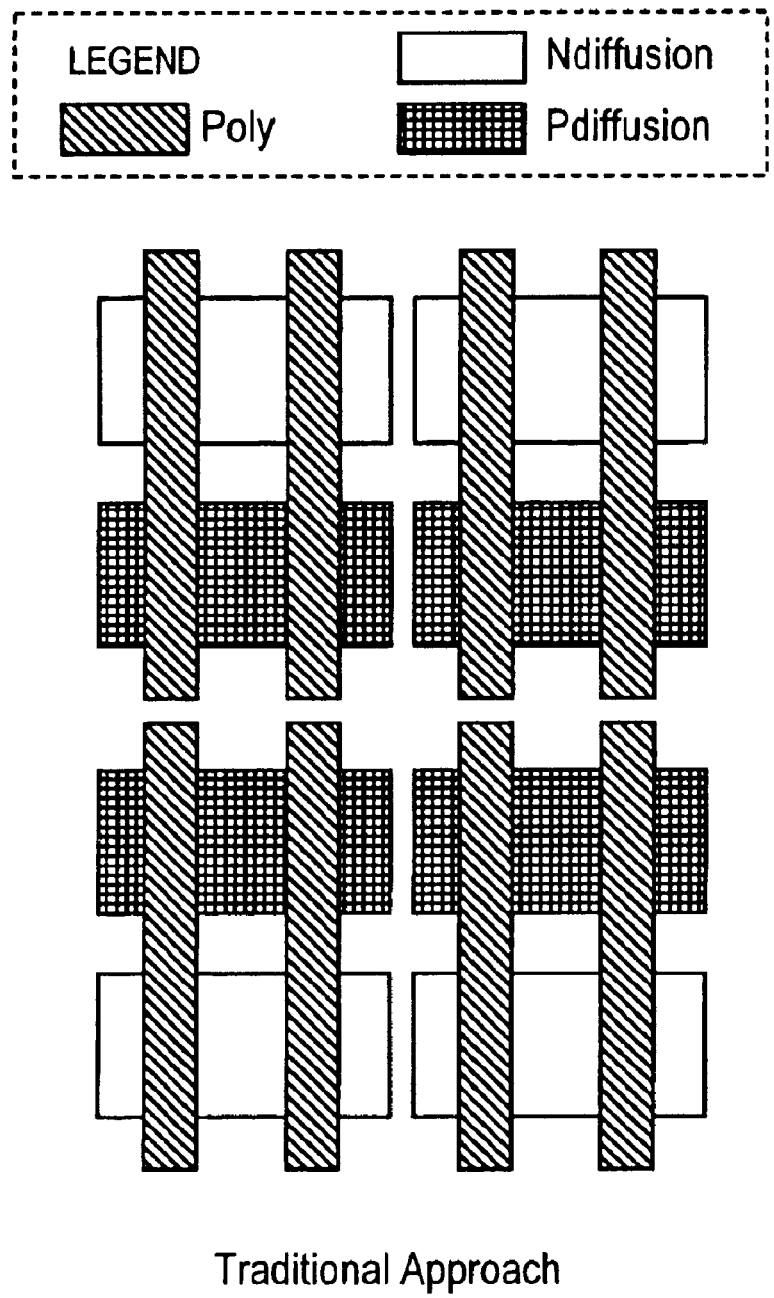
FIG. 2 is a diagram of a plan view of a typical gate array architecture layout.
Figure 4:
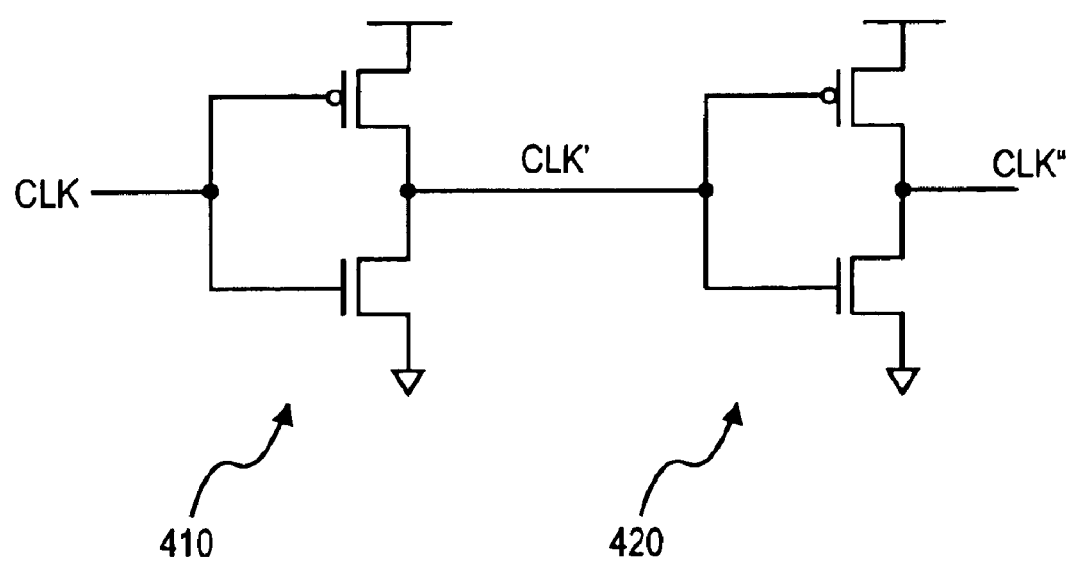
FIG. 4 is a diagram illustrating in greater detail a portion of the diagram illustrated in FIG. 3.

An embodiment of a gate array architecture, such as the embodiment illustrated in FIG. 2, complements a traditional "sea of transistors" gate array with small transistors, such as on the order of one-third the size of full-sized transistors, in this particular embodiment, for example. This allows the creation of integrated circuit chips with a lower overall power consumption without the additional design overhead associated with customized circuitry, as previously described. The functional hardware configuration to implement the internal clock buffering for sequential cells, such as clock buffering circuits 410 and 420, is illustrated in FIG. 3 and in greater detail in FIG. 4.

The energy employed to charge a capacitive load is given by equation 1 below.

$$E = CV^2 \quad [1]$$

where E is energy, C is capacitance, and V is voltage.

From this equation, it is apparent that a reduction in the individual capacitive load reduces the energy consumed by the same factor, thus resulting in a lower overall consumption. From examining FIG. 4, it may be inferred that the power saving per cell is realized from the lower input capacitance on CLK, CLK' and CLK", resulting in a lower switching power per cell.

FIG. 1 is a plan diagram illustrating an embodiment of a layout of a gate array architecture in accordance with the present invention. This particular gate array architecture includes a capacitance improved layout. Therefore, each row of "regular" or full" sized transistors, the larger transistors is this embodiment, is complemented with-Few with a row of "small" transistors, the smaller transistors in this embodiment, which may be used for clock buffering and to create logic gates that will consume less power compared with full or regular sized transistors. Therefore, in this particular embodiment, two separate and distinct sizes of transistors are employed so that the smaller of the two may be applied to operations that typically consume significant or greater amounts of power.

An integrated circuit including a metallization layer formed for a gate array architecture embodiment in accordance with the present invention includes the benefits previously described of a traditional gate array architecture approach, however, without the larger power consumption typically associated with the traditional gate array architecture approach. As previously described, the nature of a traditional gate array architecture is to provide a sea of generic transistors which are then interconnected with metallization to implement a given logic function. This approach allows quick development times that, however, typically result in greater power consumption due to the presence of full size transistors for clock buffering, for example. This higher power consumption of a traditional gate array design may become a significant contributor to the cost of a part as densities of integrated circuits increase and it becomes more difficult, therefore, and more costly to dissipate heat in such an environment. The capacitive load reduced gate array architecture of this embodiment, previously described, also uses an array of regular or full sized transistors; however, to achieve better power consumption, the regular sized transistors are complemented with rows of "small" devices which may then be configured as the internal clock buffer for the cell, as previously described. Therefore, this particular embodiment has the benefits of a traditional gate array architecture with the additional benefit of low power consumption.

Figure 5:
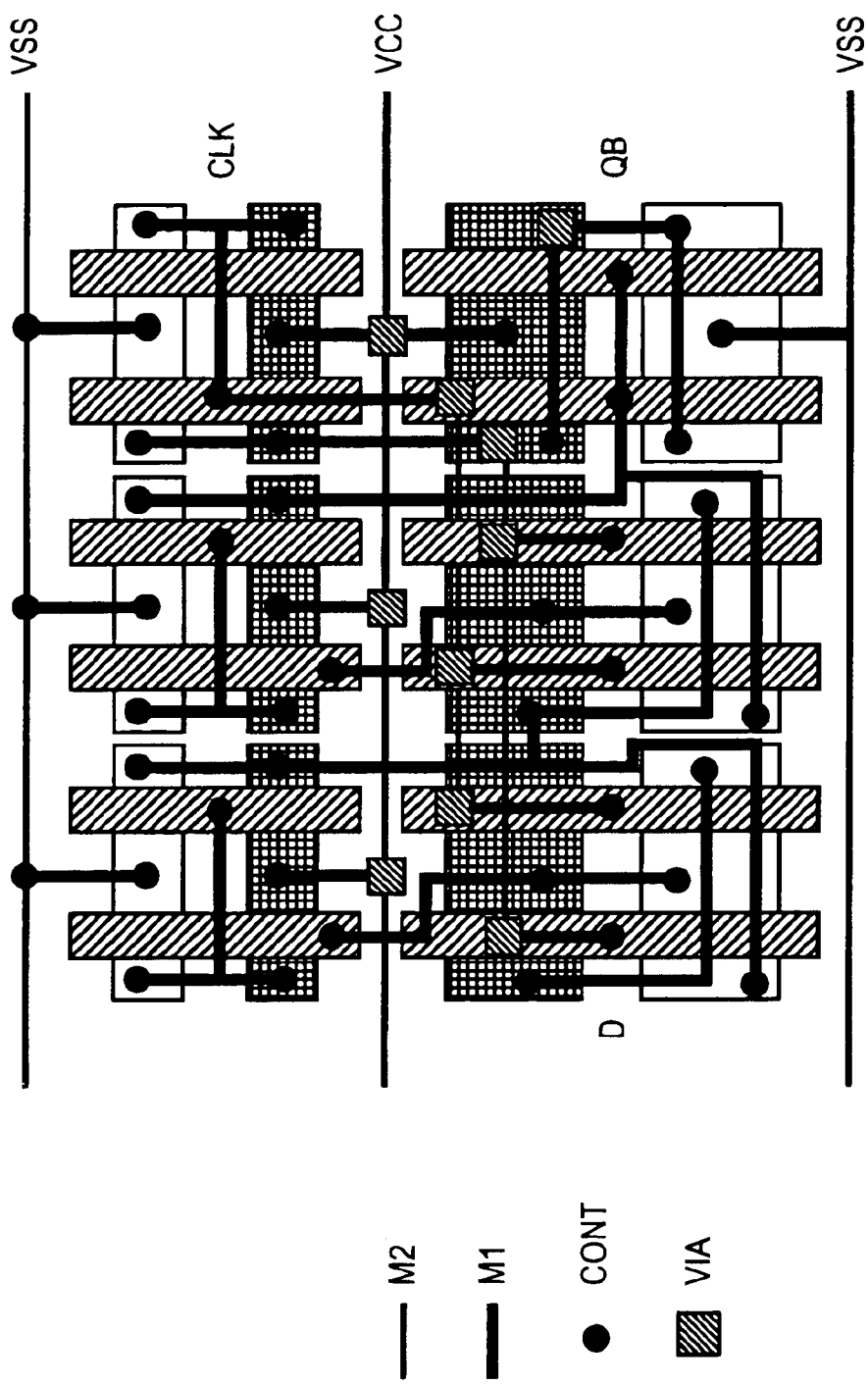
FIG. 5 is a schematic diagram illustrating a layout of metallization for the circuit of FIG. 3 using the embodiment of a gate array architecture of FIG. 1.

The table illustrated in FIG. 5 compares the simulated power consumption resulting in switching the clock signal applied to the input port of a flip-flop using a variety of gate array architecture techniques. Techniques that are compared include the embodiment illustrated in FIG. 2, the embodiment illustrated in FIG. 1, and a technique used in a commercially available product produced by Silicon Architects (SiArc), of Palo Alto, Calif., known as Cell-Based Array (CBA). As illustrated, the embodiment illustrated in FIG. 2 produces the lowest power consumption among these approaches, although, it is expected that a customized cell may be designed to reduce power consumption further. Another reason the approach in this particular embodiment is particularly desirable is that flip-flops typically are a significant proportion of the functional blocks employed in typical integrated circuit (IC) chips. For example, typically, approximately 20 percent or more of total cells of a digital IC may be flip-flops, which may use 50 percent or more of the total cell area of the IC.

The embodiment of a gate array architecture illustrated in FIG. 2 includes a semiconductor substrate having a plurality of N-type diffusion regions and P-type diffusion regions. Furthermore, as illustrated in FIG. 2, these diffusion regions have partially overlaying polysilicon landing types to form N-type and P-type transistors. The regions are relatively-sized to form two distinct transistor sizes in this particular embodiment, smaller N-type and P-type transistors and larger N-type and P-type transistors. In the embodiment illustrated in FIG. 1, the successive rows of small diffusion regions, two in this embodiment, are followed by successive rows of regular or full-sized diffusion regions, two in this embodiment. The immediately successive rows in the two differently sized-regions in this particular embodiment have opposite polarity. Furthermore, as illustrated, the polysilicon landing sites from these smaller and larger regions are not connected or coupled. FIG. 5 illustrates a layout for metallization to implement the circuit shown in FIG. 3 using the embodiment shown in FIG. 1, although, of course, the invention is not limited in scope to this particular layout or to the embodiment illustrated in FIG. 1. As illustrated, ovals denote connections between layers, squares denote vias, thick black lines denote the metal one layer interconnect, and the thin black lines denote the metal two layer interconnect.

Although the invention is not limited in scope in this respect, the relative capacitance of the larger and smaller relatively sized transistors for the embodiment illustrated in FIG. 2 is on the order of one-third, that is, the small transistors have approximately one-third the capacitance of the full or regular-sized transistors, corresponding to the relative transistor size. As previously indicated, once the gate array architecture is formed in silicon, an interconnect is formed overlying the gate array architecture. For an integrated circuit implementing the circuit illustrated in FIG. 3, the interconnect formed is adapted to connect the transistors of the gate array architecture to form a flip-flop. Furthermore, for the embodiment illustrated in FIG. 1, the interconnect is further adapted to connect the transistors of the gate array architecture so that the internal clock buffers of the flip-flop, such as those illustrated in FIG. 4 for this particular embodiment, for example, are formed from the smaller transistors.

Figure 7:
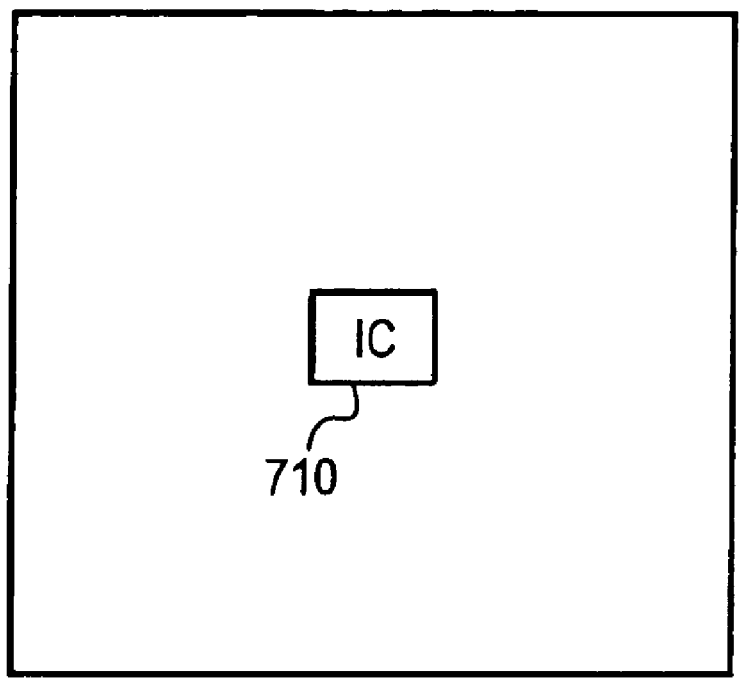
FIG. 7 is a schematic diagram illustrating an embodiment of an integrated circuit (IC) in accordance with the present invention that may be incorporated into a variety of possible platforms.

As previously suggested, this particular embodiment may be repeated throughout an integrated circuit chip and employed to implement a variety of functional elements for the overall chip. Such an integrated circuit chip employing this particular embodiment of a gate array architecture, may typically be included on a motherboard that is incorporated in a personal computer, such as a lap top or desk top computer, although the invention is not limited in scope in this respect. Likewise, it might be employed in a communication device, such as a pager or cell phone, or, alternatively, in a computer peripheral, just to provide a few additional examples. For example, FIG. 7 is a schematic diagram illustrating an embodiment 710 of an IC in accordance with the present invention. As illustrated, embodiment 710 is incorporated in unit 700, that may comprise a computer, a computer peripheral, a communication device, or another platform that may employ such an embodiment.

The invention, of course, is not limited in scope to a particular technique for fabricating an integrated circuit chip that includes an embodiment of a gate array architecture in accordance with the present invention. However, typically, a silicon or semiconductor substrate is processed to form a gate array architecture of transistors in the substrate prior to the formation of the metallization interconnect. As previously described, this is one of the advantages of employing a gate array architecture. A variety of techniques for processing a silicon or semiconductor substrate to form the gate array architecture may be employed. Furthermore, typically the polysilicon landing sites are formed as part of the gate array architecture, for the embodiment illustrated in FIG. 1, for example. Once the gate array architecture has been fabricated, a metallization interconnect may be formed overlying the gate array architecture. Additional background information about semiconductor manufacturing technology is provided, for example, in "CMOS Processing Technology," Chapter 3 of the aforementioned *Principles of CMOS VLSI Design* by N. Weste and K. Eshraghian.

Another advantage of this particular embodiment of a gate array architecture in accordance with the present invention, as previously described, is that it may be stored as a data file, for example. Where the gate array architecture is employed in this fashion, an article, such as a storage medium comprising, for example, a disk or hard drive, may have instructions stored thereon. The instructions, when executed, such as by a computer or similar computing platform, result in the capability being available to design the layout of an integrated circuit chip for fabrication. In this particular embodiment, of course, the integrated circuit chip includes a gate array architecture having relatively sized regions to form two distinct sizes of transistors, smaller N- and P-type transistors and larger N- and P-type transistors. The additional features previously described may also be designed with this capability.

While certain features of the invention have been illustrated as described herein, many modifications, substitutions, changes and equivalents will now occur to those skilled in the art. It is, therefore, to be understood that the appended claims are intended to cover all such modifications and changes as fall within the true spirit of the invention.

What is claimed is:

1. A method of fabricating an integrated circuit chip comprising:

processing a semiconductor substrate to form a gate array architecture of transistors in the substrate, the gate array architecture comprising a plurality of N-type diffusion regions and P-type diffusion regions; said diffusion regions having partially overlying polysilicon landing sites at least one forming both N-type and P-type transistors;

wherein the regions are relatively-sized to form two distinct transistor sizes, smaller N- and P-type transistors and larger N- and P-type transistors; and wherein said transistors are formed in said gate array architecture so that an interconnect disposed thereon is capable of connecting said smaller transistors to form internal clock buffers.

2. The method of claim 1, wherein said semiconductor substrate comprises a silicon substrate.

3. The method of claim 2, wherein said processing said silicon substrate to form a gate array architecture comprises:

forming said partially overlying polysilicon landings so that said landings for the smaller and larger transistors are not connected.

4. The method of claim 3, wherein a ratio between the two distinct transistor sizes is on an order of one-third.

5. The method of claim 4, wherein a ratio between capacitance of the larger and smaller relatively sized transistors is on an order of one-third.

6. The method of claim 3, and further comprising:

forming an interconnect overlying said gate array architecture.

7. The method of claim 6, wherein said forming an interconnect comprises forming an interconnect that connects the transistors of the gate array architecture to form a flip-flop having internal clock buffers.

8. The method of claim 7, wherein said forming an interconnect comprises forming an interconnect that connects the transistors of the gate array architecture so that the internal clock buffers of the flip-flop are formed from the smaller transistors.

* * * * *

UNITED STATES PATENT AND TRADEMARK OFFICE
CERTIFICATE OF CORRECTION

PATENT NO. : 6,753,209 B2 Page 1 of 1
DATED : June 22, 2004
INVENTOR(S) : Possley It is certified that error appears in the above-identified patent and that said Letters Patent is hereby corrected as shown below:

Column 4,
Line 18, delete "with-Few".

Signed and Sealed this

Thirtieth Day of November, 2004

JON W. DUDAS
*Director of the United States Patent and Trademark Office*